United States Patent [19]

Urai

[11] Patent Number: 5,798,547
[45] Date of Patent: Aug. 25, 1998

[54] NON-VOLATILE SEMICONDUCTOR MEMORY DEVICE HAVING NAND STRUCTURE CELLS

[75] Inventor: Takahiko Urai, Tokyo, Japan

[73] Assignee: NEC Corporation, Japan

[21] Appl. No.: 748,278

[22] Filed: Nov. 13, 1996

[30] Foreign Application Priority Data

Nov. 29, 1995 [JP] Japan .................. 7-311260

[51] Int. Cl.[6] ........................... H01L 29/788
[52] U.S. Cl. ............... 257/316; 257/326; 365/185.17; 365/185.31; 365/185.33
[58] Field of Search ................. 257/316, 326; 365/185.17, 185.29, 185.31, 185.33, 230.06

[56] References Cited

U.S. PATENT DOCUMENTS 5,197,027 3/1993 Challa .................. 365/185
5,293,337 3/1994 Aritome et al. ......... 365/185

FOREIGN PATENT DOCUMENTS 3-290960 12/1991 Japan.

OTHER PUBLICATIONS

Masuoka et al; "New Ultra High Density Eprom and Flash Eeprom With Nand Structure Cell"; 1987; pp. 552–555; IEEE.

Primary Examiner—Sara W. Crane
Attorney, Agent, or Firm—Hayes, Soloway, Hennessey, Grossman & Hage, P.C.

[57] ABSTRACT

Flash EEPROM with NAND structure cells has a plurality of memory cell arrays. Each memory cell array has NAND structure of memory cell transistors arranged in column direction and connected serially. Each NAND structure cell has at its ends first and second select transistors, respectively. Control gates of corresponding cell transistors forming the NAND structure cells in respective memory cell arrays are connected together by control gate lines which are formed in row direction constituting word lines. Similarly, control gates of the first and second select transistors of respective memory cell arrays are connected respectively to first and second select gate lines parallel to the word lines. Erase control means is additionally provided to selectively supply erase control voltages, consisting of either a first voltage equal to well potential or a second voltage sufficient to cause data erasure at memory cell transistors, to those selected and unselected control gate lines, thereby to enable word line-by-line erasure of stored data.

4 Claims, 4 Drawing Sheets

NON-VOLATILE SEMICONDUCTOR MEMORY DEVICE HAVING NAND STRUCTURE CELLS

BACKGROUND OF THE INVENTION

1. Field of the Invention

The present invention relates to a non-volatile semiconductor memory device and, more particularly to a flash EEPROM (electrically erasable programmable read-only memory) having NAND structure cells with logic circuits for enabling selective erase operation.

2. Description of the Related Art

A flash EEPROM with NAND structure cells, which was originally proposed in F. Masuoka et al "New Ultra High Density EPROM and Flash EEPROM with NAND Structure Cell," published in the Technical Digest of International Electron Devices Meeting, pp.552–555 (December 1987), is characterized by very small cell area permitting bit density as high as a DRAM. This is due to the reduction in the number of memory cell-to-bit line contacts, thereby to save memory cell area. The high bit density and its capability of retaining written data without resorting to backup batteries enable a NAND-structured flash EEPROM to be used as, among others, a stationary replacement for a magnetic disk drive memory system. However, since a NAND-structured flash EEPROM is inherently not adapted, as described hereunder, to bit-by-bit erasure of stored data for rewrite operation but only to block-by-block or well-by-well erasure, efforts have been made to make the unit of simultaneous erasure reasonably small or comparable to the number of bits commonly subjected to simultaneous erasure in magnetic disk drive memory system.

Referring to FIG. 1 showing a schematic circuit diagram of a conventional EEPROM with NAND structure cells adapted to well-by-well erase operation, p-type wells 1 and 2 are formed in the surface of n-type semiconductor substrate 10 in such a manner that they are arranged side by side in the column direction with source line S (to be described later) lying therebetween. In p-type well 1, first, second, . . . , and n-th memory cell arrays $AR_{11}$, $AR_{12}$, . . . , $AR_{1n}$, are formed. First memory cell array $AR_{11}$ includes eight memory cell transistors $M_{111}$, $M_{121}$, . . . , $M_{18}$ arranger in the column direction and serially connected with source and drain of every two adjacent cell transistors formed by single $n^+$ diffusion region to constitute a first NAND structure having drain of first cell transistor $M_{111}$ and source of eighth cell transistor $M_{181}$ respectively for connection with first and second select transistors to be described below. Similarly, second memory cell array $AR_{12}$ includes eight memory cell transistors $M_{112}$, $M_{122}$, . . . , $M_{182}$ arranged and mutually serially connected in a manner similar to first memory cell array $AR_{11}$ to constitute a second NAND structure having drain of first cell transistor $M_{112}$ and source of eighth transistor $M_{182}$ respectively for connection with first and second select transistors to be described below. The n-th memory cell array $AR_{1n}$ includes memory cell transistors $M_{11n}$, $M_{12}$, . . . , $M_{18n}$ arranged and mutually serially connected in a manner similar to first and second memory cell arrays $AR_{11}$ and $AR_{12}$ to constitute n-th NAND structure having drain of first cell transistor $M_{11n}$ and source of eighth cell transistor $M_{18n}$ respectively for connection with first and second select transistors to be described below. Drains of first memory cell transistors $M_{111}$, $M_{112}$, . . . , $M_{11n}$ respectively of the first, second, . . . and n-th memory cell arrays $AR_{11}$, $AR_{12}$, . . . , $AR_{1n}$ serve also as sources of first select transistors $T_{111}$, $T_{112}$, . . . , $T_{11n}$, respectively, and sources of eighth memory cell transistors $M_{181}$, $M_{182}$, . . . , $M_{18n}$ respectively of the first, second, . . . , and n-th memory cell arrays $AR_{11}$, $AR_{12}$, . . . , $AR_{1n}$ serve also as drains of second select transistors $T_{121}$, $T_{122}$, . . . , $T_{12n}$, respectively. Control gates of first cell transistors $M_{111}$, $M_{112}$, . . . , $M_{11n}$ of each of the first to n-th memory cell arrays; control gates of second cell transistors $M_{121}$, $M_{122}$, . . . , $M_{12n}$ of each thereof; . . . ; and control gates of eighth cell transistors $M_{181}$, $M_{182}$, . . . , $M_{18n}$ of each thereof are connected in common by control gate lines $CG_{11}$, $CG_{12}$, . . . , $CG_{18}$, respectively, to form word lines lying in row direction. Similarly, first (drain-side) select transistors $T_{111}$, $T_{112}$, . . . , $T_{11n}$ of the first to n-th memory cell arrays and second (source-side) select transistors $T_{121}$, $T_{122}$, . . . , $T_{12n}$ of the first to n-th memory cell arrays are connected in common by first and second select gate lines $SG_{11}$ and $SG_{12}$, respectively.

In another p-type well 2, first, second, . . . , and n-th memory cell arrays $AR_{21}$, $AR_{22}$, . . . , $AR_{2n}$ are formed, with corresponding NAND structure cells and their interconnections arranged in the same manner as those in the first to n-th memory cell arrays $AR_{111}$ to $AR_{1n}$ in p-type well 1, in symmetry with those corresponding thereto with respect to source line S. Those corresponding structural elements in p-type well 2 are denoted in FIG. 1 by reference numerals similar to those in p-type well 1 with the most significant digit of the suffix changed from 1 to 2. To describe first memory cell array $AR_{21}$ in p-type well 2 more specifically for example, memory cell transistors $M_{211}$, $M_{221}$, . . . , $M_{281}$ are arranged in the order beginning with the furthest end from source line S, to form NAND structure cell, with first (drain-side) select transistor $T_{211}$ having source common to drain of first cell transistor $M_{211}$ placed at a point furthest from source line S and with second (source-side) select transistor $T_{221}$ having drain common to source of eighth cell transistor $M_{281}$ placed at a point closest to source line S. The same applies to other memory cell arrays $AR_{22}$ to $AR_{2n}$ in p-type well 2. Control gate lines $CG_{21}$, $CG_{22}$, . . . , $CG_{28}$ are also formed for these memory cell arrays $AR_{21}$ to $AR_{2n}$ in a manner similar to the corresponding control gate lines $CG_{11}$, $CG_{12}$, . . . , $CG_{18}$, symmetrically with the latter with respect to source line S. Similarly, first and second select gate lines $SG_{21}$ and $SG_{22}$ are formed in a manner similar to those corresponding select gate lines $SG_{11}$ and $SG_{12}$, symmetrically with the latter with respect to source line S.

On the other hand, in the column direction parallel to that of memory cell arrays $AR_{11}$, $AR_{12}$, . . . , $AR_{1n}$ and $AR_{21}$, $AR_{22}$, . . . , $AR_{2n}$, bit lines $B_1$, $B_2$, . . . , $B_n$ are arranged, and connected to the above-mentioned memory cell arrays in such a manner that drains of first select transistors $T_{111}$ and $T_{211}$ of first memory cell arrays $AR_{11}$ and $AR_{21}$ in both p-type wells 1 and 2 are connected to bit line $B_1$, that drains of first select transistors $T_{112}$ and $T_{212}$ of second memory arrays $AR_{12}$ and $AR_{22}$ are connected to bit line $B_2$, and drains of first select transistors $T_{11n}$ and $T_{21n}$ of n-th memory cell arrays $AR_{1n}$ and $AR_{2n}$ are connected to bit line $B_n$. Two p-type wells 1 and 2 are connected to well lines $W_1$ and $W_2$, respectively. It should be noted in FIG. 1 that memory cell arrays formed in p-type wells 1', 2' adjacently to wells 1 and 2 are not shown for simplicity and clarity.

Read and write (program) operation for this conventional NAND-structured EEPROM will now be described assuming that memory cell transistor $M_{122}$ is to be selected for such operation. In read operation, power supply voltage (5V) is applied to first and second select gate lines $SG_{11}$ and $SG_{12}$ to turn ON first and second select transistors $T_{112}$ and $T_{122}$, while 0 volt is applied to control gate line $CG_{12}$, to which the gate of selected memory cell transistor $M_{122}$ is connected, with power supply voltage (5V) applied to other control gate lines than $CG_{12}$ (i.e., control gate lines $CG_{11}$, $CG_{13}$, ..., $CG_{18}$) and with bit line $B_2$ and source line S set at 1V and 0V, respectively, whereby conductive or non-conductive state of memory cell transistor $M_{122}$ is detected for readout of stored data bit.

In write (program) operation, first and second select gate lines $SG_{11}$ and $SG_{12}$ are supplied with high voltage (10 V) and 0V, respectively, while control gate lines other than the selected control gate line $CG_{12}$ (i.e., control gate lines $CG_{11}$, $CG_{13}$, ..., $CG_{18}$) are supplied with 10V, with a higher voltage (20V) applied to the selected control gate line $CG_{12}$. At the same time, 0V signifying data bit "0" to be stored is applied to bit line $B_2$ while intermediate voltage (7V) is applied to all other bit lines. This causes selective injection of electrons into floating gate of memory cell transistor $M_{122}$ due to the Fowler-Nordheim (F-N) tunneling, bringing cell transistor $M_{122}$ into programmed state, where the threshold voltage of cell transistor $M_{122}$ is shifted to a higher level resulting in non-conductive state. It should be noted here that the threshold voltage is designed to be lower than the voltage (power supply voltage) applied to non-selected control gate lines (i.e., control gate lines $CG_{11}$, $CG_{13}$, ..., $CG_{18}$ in the above example) for read operation but higher than the voltage (0V) applied to the selected control gate line (i.e., control gate line $CG_{12}$). This is because the data readout from NAND structure cell requires unselected memory cell transistors to be always in conductive state while the reference voltage for the control gate of selected memory cell transistor is 0 V. The above-mentioned application of the intermediate voltage (7V) to bit lines other than the selected bit line $B_2$ (i.e., bit lines $B_1$, $B_3$, ..., $B_n$) and high voltage (10V) to unselected control gate lines makes it possible to set control gate-channel voltage of all unselected memory cell transistors at 10V to 13V, which is lower than the corresponding control gate-channel voltage (20V) for the selected memory cell transistor $M_{122}$, thereby to unfailingly prevent undesired write operation in unselected memory cell transistors.

In erase operation, 20V is applied to both first and second select gate lines $SG_{11}$ and $SG_{12}$, 0V to all control gate lines $CG_{11}$, $CG_{12}$, ..., $CG_{18}$, and 20V to well line $W_1$, while bit lines $B_1$ to $B_n$ and source line S are left in open state. The application of these voltages results in the application of 20V of reverse polarity across control gate and channel of each of memory cell transistors $M_{111}$, $M_{112}$, ..., $M_{181}$, $M_{112}$, $M_{122}$, ..., $M_{18n}$ formed in p-type well 1, causing electrons stored in the floating gates of those memory cell transistors to be removed simultaneously, with the result that the threshold voltage of all those memory cell transistors to be shifted to a lower level, which can cause conductive state in read operation.

It will be seen that the erase operation is performed simultaneously for all the memory cell transistors in p-type well 1 as 20V is applied across control gate and channel of each of those cell transistors formed therein.

In a NAND-structured EEPROM described above, which utilizes the F-N tunneling for electron injection into floating gate, it is common practice to write mutually different data simultaneously at a plurality of addresses, in view of relatively small current required for write operation and relatively slow write speed in terms of each memory cell. Such write operation can be achieved on a word line-by-word line basis (i.e., control gate line-by-control gate line basis) by applying the above-mentioned 0- or 1- representing voltages (0V for "0," and 7V for "1") respectively to bit lines $B_1$ to $B_n$, and the prescribed voltages to selected and unselected control gate lines as described above. Therefore, it is not difficult, for a NAND structured EEPROM, to make the unit of simultaneous write operation comparable to that of magnetic storage devices, where the unit of write/erase operation is generally 512 bytes or 1K bytes, often called sector. In contrast to write operation, the unit of simultaneous erasure in the NAND-structured EEPROM cannot be easily reduced to that level, because erase operation in the above-described prior art system is performed on a well-by-well basis. It is of course theoretically possible to reduce the size of p-type wells so as to make the unit of simultaneous erasure comparable to that of write operation. However, that approach would seriously reduce bit density of NAND-structured EEPROM, particularly because diffusion margins are required at each side of the regions defining p-type wells due to undesired lateral spread of diffusion involved in manufacturing process.

To overcome the above-mentioned problem, Japanese Patent Application Kokai Publication No. Hei 3-290960 entitled "Non-volatile Semiconductor Memory Device" proposes that p-type well having NAND structure cell arrays should be divided into a plurality of erase unit blocks. For that purpose, source diffusion layers of select transistors positioned furthest from bit lines (i.e., second select transistors $T_{121}$, $T_{122}$, ..., $T_{12n}$, $T_{221}$, $T_{222}$, ..., $T_{22n}$ in the first prior art device described above) are made to surround memory cell array regions including desired number of NAND structure cells, thereby to define erasure unit blocks. For each of these erasure unit blocks, additional wiring forms contact with p-type well. The application of a high potential to the above-mentioned source diffusion layer causes depletion layer to be developed to isolate the desired one (selected for erasure) of the memory cell array regions formed in the p-type well, while the erase-causing voltage is applied through the above-mentioned additional wiring of the desired region, thereby limiting the erase operation only to the desired region, i.e., erasure unit block. However, even with this approach, the smallest achievable unit of erasure is reported to be in the order of 4K bytes.

SUMMARY OF THE INVENTION

An object of the invention, therefore, is to overcome the problems associated with the prior art and to provide flash EEPROM with NAND structure cells having effective means for limiting the area of simultaneous data erasure in such EEPROM to an area comparable to the size corresponding to 512 bytes or 1K bytes of data.

According to the present invention, there is provided a flash EEPROM with NAND structure cells having a plurality of memory cell arrays formed in a well of one conductivity type in turn formed in the surface of a semiconductor substrate of opposite conductivity type, each said memory cell arrays being arranged in parallel in column direction and having a plurality of memory cell transistors, source and drain of every two adjacent ones of said memory cell transistors being formed of a single highly doped diffusion region formed in said well, control gates of corresponding ones of said memory cell transistors included respectively in said memory cell arrays being connected respectively to control gate lines lying in parallel in row direction, and first and second ends of each of said NAND structure cells being connected to source and drain respectively of first and second select transistors having control gates connected respectively to first and second select gate lines lying in parallel with said control gate lines, characterized by further comprising logic circuit-based erase control means adapted to control erase operation on control gate line-by-control gate line basis by applying erase control signal of first voltage to those control gate line(s) selected for erasure and that of second voltage to those control gate lines unselected for erasure.

BRIEF DESCRIPTION OF THE DRAWINGS

The above and other objects, features and advantages of the present invention will be apparent from the following description of preferred embodiments of the invention taken with reference to the accompanying drawings, in which.

PREFERRED EMBODIMENTS OF THE INVENTION

Figure 1:
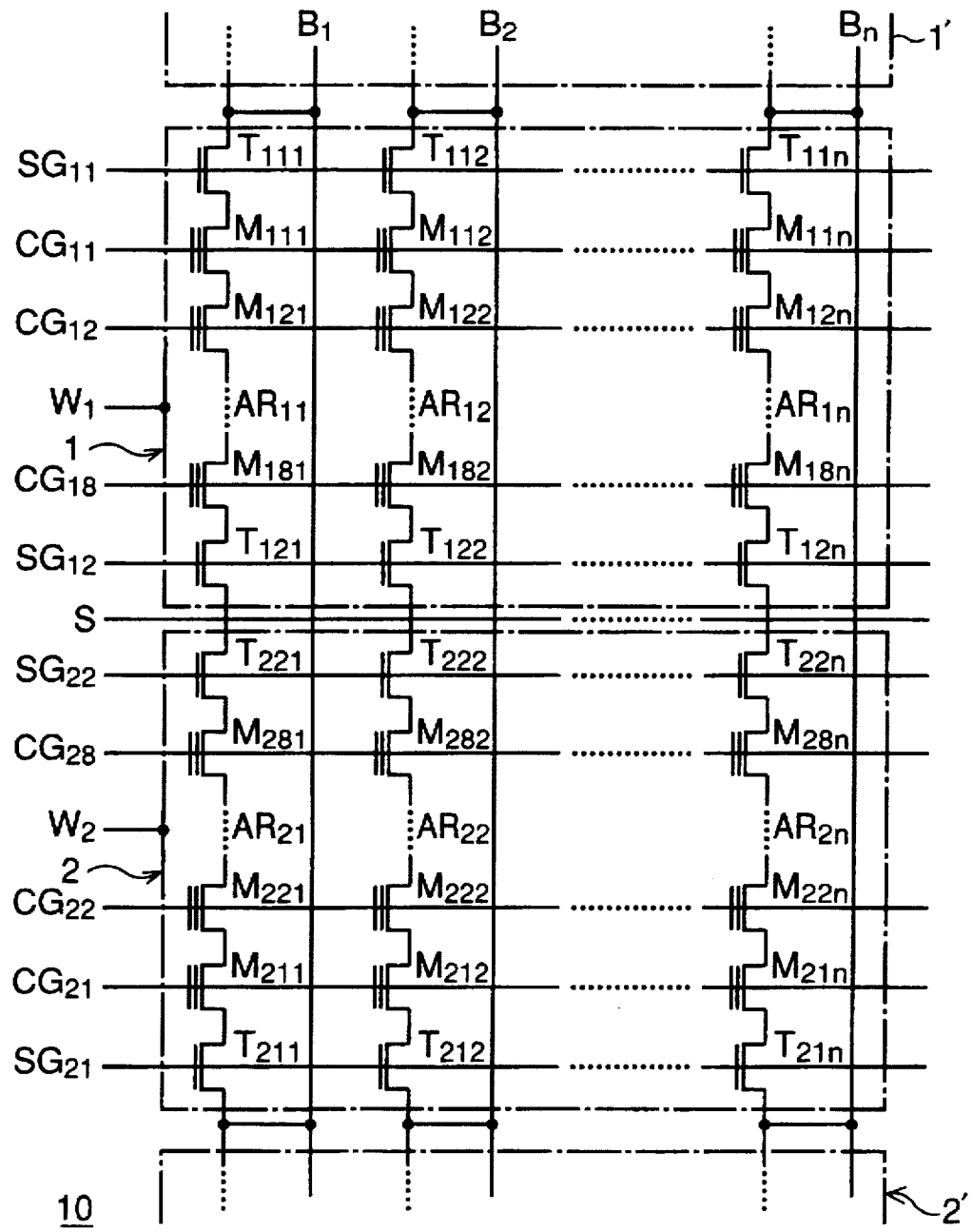
FIG. 1 shows a schematic circuit diagram of the prior art flash EEPROM with NAND structure cells.

Now, preferred embodiments of the invention will be described with reference to the drawings, in which like structural elements as in the prior art described above are denoted by like reference numerals and characters with their description unrepeated.

Figure 2:
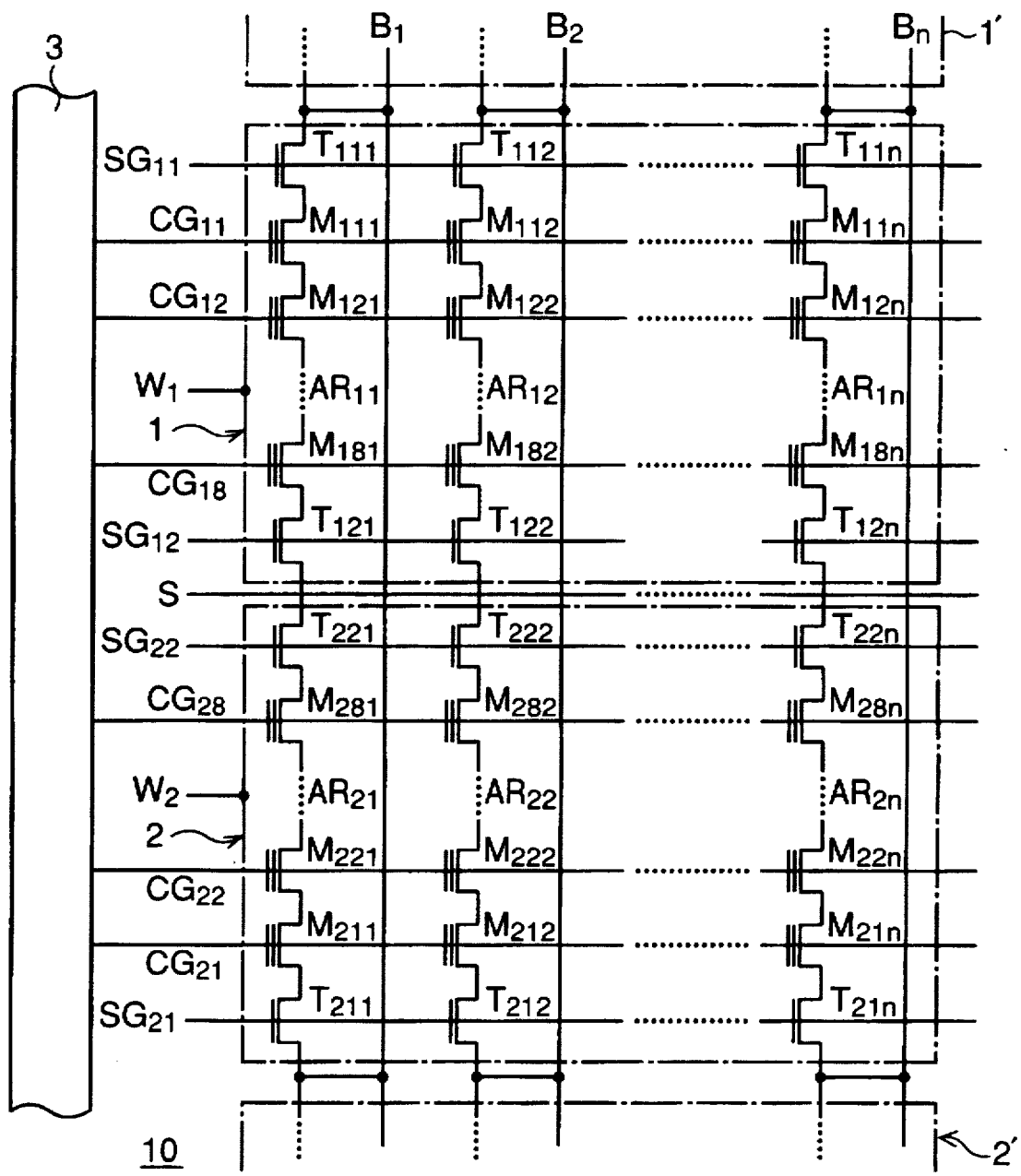
FIG. 2 shows a similar circuit diagram, including partial block diagram, of an embodiment of the present invention.

Referring to FIG. 2 showing schematic circuit diagram, similar to FIG. 1, of an embodiment of the invention, an erase control circuit 3 is provided, which is arranged in common to all the memory cell arrays $AR_{11}$–$AR_{1n}$ and $AR_{21}$ to $AR_{2n}$ and to which are connected control gate lines $CG_{11}$–$CG_{18}$ and $CG_{21}$–$CG_{28}$.

Figure 3A:
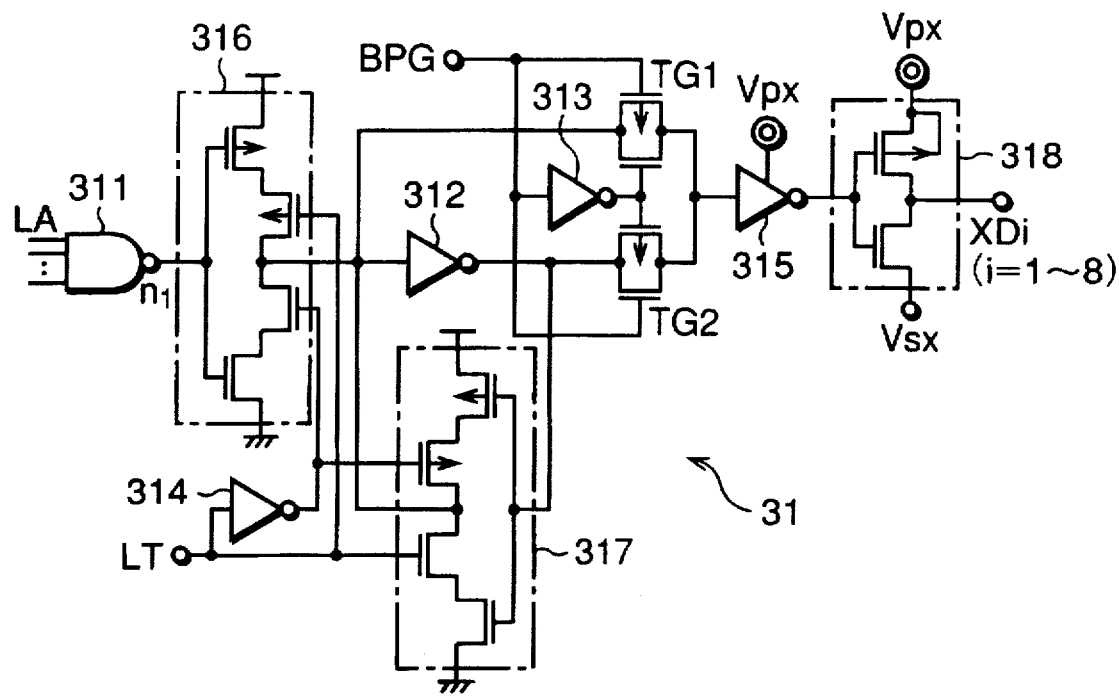
FIG. 3A shows detailed circuit diagram of a part of a structural element of the embodiment shown in blocks in FIG. 2.
Figure 3B:
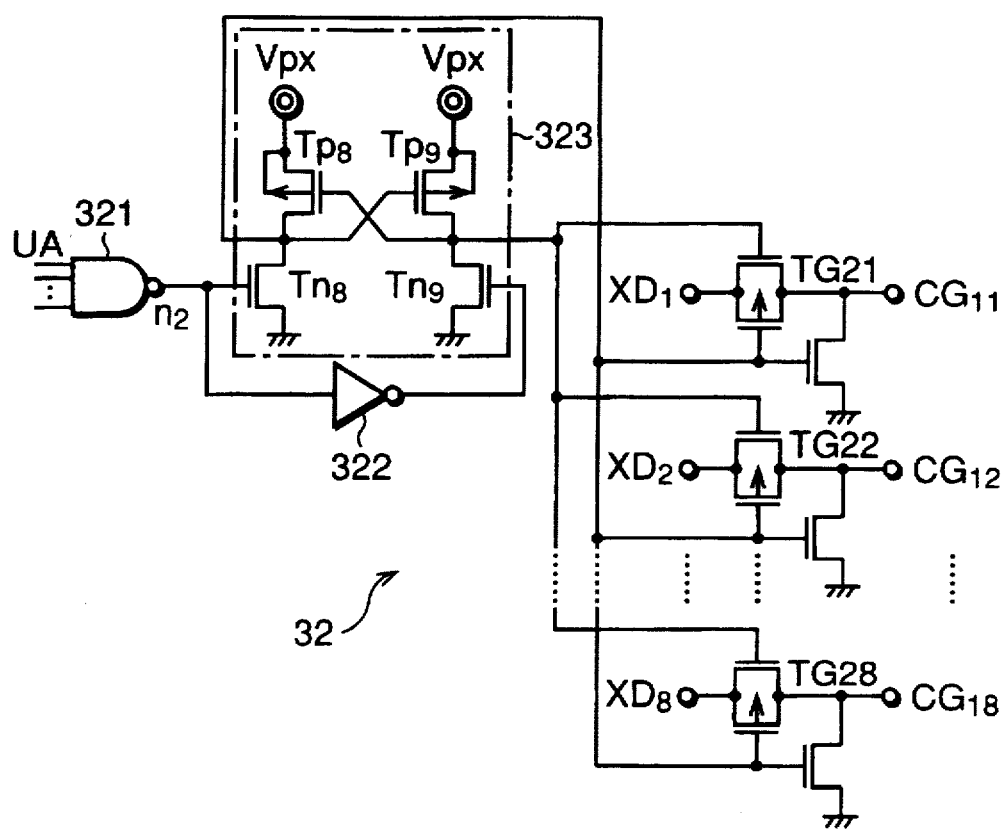
FIG. 3B shows detailed circuit diagram of another part of the same structural element of the embodiment shown in FIG. 2.

Erase control circuit 3 includes subdecoder 31 and main decoder 32, whose circuit diagrams are shown in FIGS. 3A and 3B, respectively. For convenience of illustration, FIG. 3A shows logic circuits of subdecoder 31 for providing one of decode signals $XD_1$ to $XD_8$ corresponding respectively to eight control gate lines $CG_{11}$–$CG_{18}$ or $CG_{12}$–$CG_{28}$, which means that subdecoder 31 actually has eight logic circuits identical to the one shown in FIG. 3A. Similarly, FIG. 3B shows logic circuits of main decoder 32 for selectively providing erase control signals to either the eight control gate lines $CG_{11}$–$CG_{18}$ of p-type well 1 or the corresponding control gate lines $CG_{21}$–$CG_{28}$ of p-type well 2.

Subdecoder 31 has NAND circuit 311 for providing NAND output n1 of less significant bits LA of row address signal supplied to its input terminals; first clocked inverter circuit 316, to which first control signal LT is applied at the gates of second and third serially connected FETs, directly and through first inverter circuit 314, respectively, and to which NAND output n1 is applied at the gates of first and fourth serially connected FETs; second clocked inverter circuit 317, to which the control signal LT is applied at the gates of third and second FETs, directly and through first inverter 314, respectively, and to which output of clocked inverter circuit 316 from the junction of its second and third FETs is supplied at corresponding junction of second and third FETs thereof; first transfer gate device $TG_1$ whose gates are supplied with mode switching signal BPG directly and through third inverter 313, respectively, and whose joined drains are supplied with the above-mentioned output from first clocked inverter 316; second transfer gate device $TG_2$ whose gates are supplied with the signal BPG directly and through third inverter 313, respectively, and whose joined drains are supplied with outputs from the clocked inverters 316 and 317 through second inverter circuit 312 and directly, respectively; and fourth inverter circuit 315 supplied with mode switching power supply voltage $V_{px}$ for supplying output of transfer gate devices $TG_1$ and $TG_2$ to fifth inverter circuit 318, whose serially connected FETs are connected at their source and drain to supply sources of the voltage $V_{px}$ and reference voltage $V_{sx}$, respectively. The above-mentioned decode signal $XD_i$ (i=1, 2, . . . , or 8), which is either $V_{px}$ (20V) or $V_{sx}$ (0 V), is output from the joined drain-source of the FETs of fifth inverter circuit 318. Which one of decode signal $XD_i$ is of voltage $V_{px}$ or $V_{sx}$ depends on the less significant bits LA of row address signal.

Main decoder 32 shown in FIG. 3B has NAND circuit 321 for providing NAND output $n_2$ of more significant bits UA of row address signal; level shifting circuit 323 whose inputs constituted by gates of FETs $Tn_8$ and $Tn_9$ are supplied with the NAND output $n_2$ directly and through first inverter circuit 322, respectively, and whose load FETs $Tp_8$ and $Tp_9$ are supplied with mode switching power supply voltage $V_{px}$; and eight transfer gate devices $TG_{21}$, $TG_{22}$, . . . , $TG_{28}$, first gate of each thereof being supplied with the output of level shifting circuit 323 and the second gate of each thereof being supplied with the complementary output from level shifting circuit 323. To the joined drains of these transfer gate devices $TG_{21}$ to $TG_{28}$ are supplied the above-mentioned decode signals, $XD_1$–$XD_8$, respectively, so that joined sources thereof may provide erase control signals of voltages $V_{px}$ or $V_{sx}$ to be supplied to control gate lines $CG_{11}$ to $CG_{18}$ or $CG_{21}$ to $CG_{28}$, respectively. The joined sources of each of these transfer gate devices $TG_{21}$ to $TG_{28}$ are shunted to the ground by FET switch which turns conductive by the complementary output from level shifting circuit 323, so that control gate lines $CG_{11}$ to $CG_{18}$ may be supplied with the decode outputs $XD_1$–$XD_8$, respectively, when p-type well 1 is selected by the more significant bits UA of the row address signal or, with ground potential when unselected (another well 2 is selected thereby).

Now, erase operation in the embodiment will be described, with reference to FIGS. 2, 3A and 3B. Description of write and read operation will be omitted because it is identical to that performed in the prior art devices described above. For convenience of description, it is assumed that control gate lines $CG_{11}$ and $CG_{18}$, each corresponding to the above-mentioned sector (512 or 1K bytes), are selected for erasure.

First, 0V is applied to selected control gate lines $CG_{11}$ and $CG_{18}$, while unselected control gate lines $CG_{12}$–$CG_{17}$ are set at 20V, equal to the voltage at well line $W_1$. The application of these voltages results in, as described hereunder, data erasure at those first and eighth cell transistors of each of the memory cell arrays $AR_{11}$ to $AR_{1n}$, which are controlled by control gate lines $CG_{11}$ and $CG_{18}$.

Each of row addresses of $CG_{11}$ and $CG_{18}$ supplied from data processing device (not shown) is divided into less significant bits LA and more significant bits UA. NAND output $n_1$ of LA is latched by first and second clocked inverter circuits 316 and 317 in response to transition of first control signal LT. More specifically, low (L) level of the control signal LT causes NAND output $n_1$ to be taken in from NAND circuit 311, and its transition to high (H) level causes the signal $n_1$ to be latched. As a result, decode output $XD_i$ (i=1 to 8) is turned to L level, which is the reference voltage $V_{sx}$ (0 V). The above applies to decode signals $XD_1$ and $XD_8$. With respect to unselected control gate lines, no LA bits are provided, with the results that no signal is latched and that decode signal $XD_i$ (i.e., $XD_2$ to $XD_7$) remains at H level, which is mode switching power supply voltage $V_{px}$ (20 V).

On the other hand, the above-mentioned more significant bits UA of row address signal are applied to NAND circuit 321, whose NAND output $n_2$ is supplied to level shifting circuit 323, which results in selection of one of p-type wells 1 and 2 (p-type well 1 in this example) by activating the transfer gate devices $TG_{21}-TG_{28}$ corresponding to p-type well 1. On the other hand, decode output $XD_i$ supplied from subdecoder 31, which consists of $XD_1$ and $XD_8$ of 0V and $XD_2$ to $XD_7$ of 20V, causes transfer gate devices $TG_{21}$ to $TG_{28}$ to provide 0V only to selected control gate lines $CG_{11}$ and $CG_{18}$, and 20V to all the unselected control gate lines $CG_{12}$ to $CG_{17}$.

Status of voltages of first control signal LT, mode switching signal BPG, mode switching power supply voltage $V_{px}$, reference voltage $V_{sx}$, decode output $XD_i$ and control gate lines $CG_{1i}$, with respect to each of read, write (program) and erase operation is shown in Table 1 below.

TABLE 1

|  |  | LT | BPG | $V_{px}$ | $V_{sx}$ | $XD_i$ | $CG_{1i}$ |
|---|---|---|---|---|---|---|---|
| Read | Selected | L | H | 5V(Vcc) | 0V | 0V | 0V |
|  | Un-selected | L | H | 5V(Vcc) | 0V | 5V(Vcc) | 5V(Vcc) 0V*¹ |
| Pro-gram | Selected | L | L | 20V | 10V | 20V | 20V |
|  | Un-selected | L | L | 20V | 10V | 10V | 10V 0V*¹ |
| Erase | Selected | L→H | H | 20V | 0V | 0V | 0V |
|  | Un-selected | L→H | H | 20V | 0V | 20V | 20V 0V*¹ |

*¹for the case of p-type well 1 unselected

It will be noted in Table 1 that all the control gate lines $CG_{11}-CG_{18}$ are set at 0V when p-type well 1 is unselected.

Figure 4:
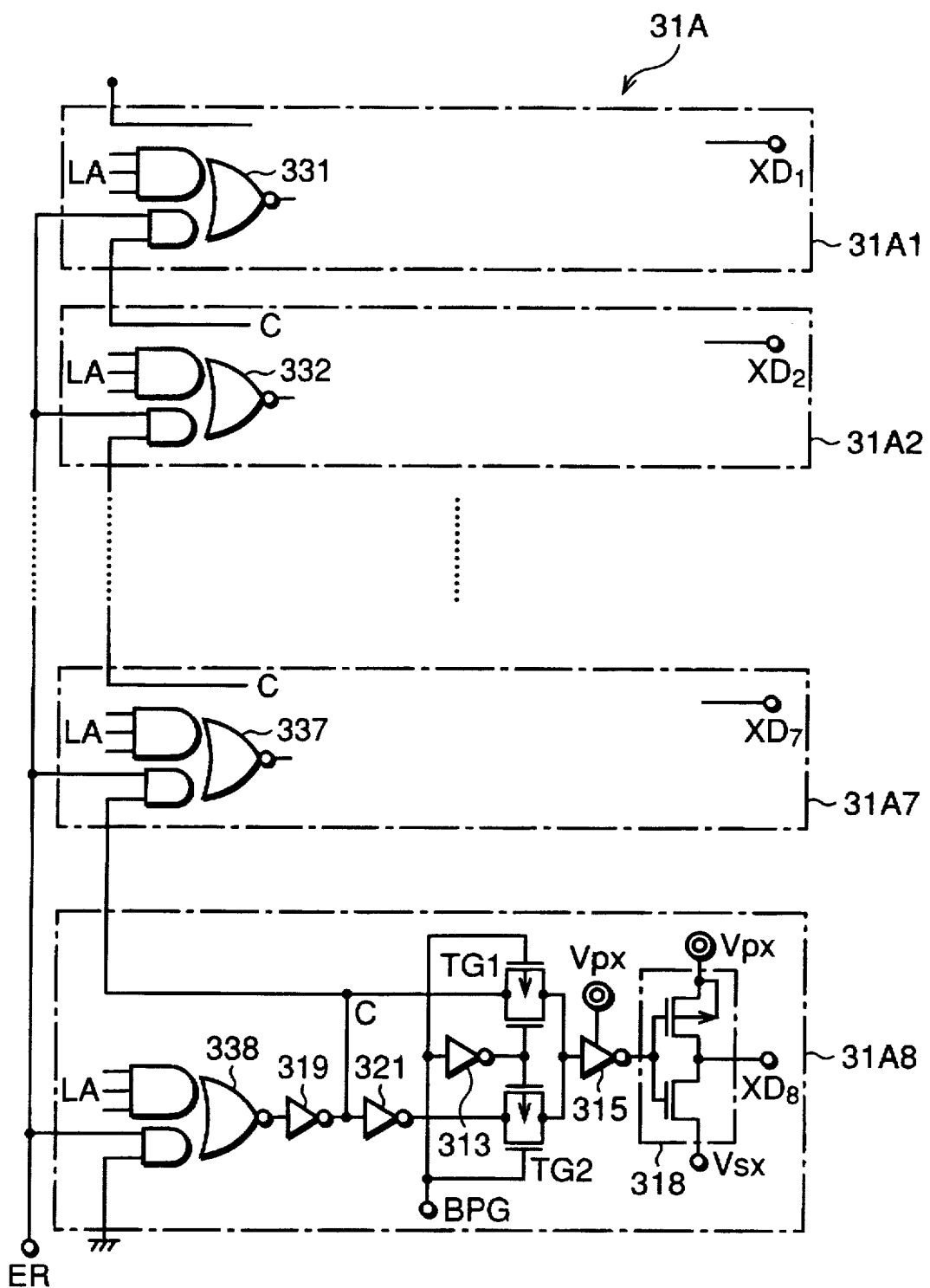
FIG. 4 shows a schematic circuit diagram of another example of the circuit shown in FIG. 3A.

Referring to FIG. 4 showing a circuit diagram of another example 31A of subdecoder 31, which characterizes a second embodiment of the present invention, the difference of the example shown there from subdecoder 31 of the first embodiment lies in having composite logic circuits 33i (i=1, 2, . . . , or 8) including AND and NOR gates adapted to provide control gate line selection signals in response to carry signal C from low-significance control gate lines lying further from bit lines, and in response to less significant bits LA of row address signal.

To describe the modified subdecoder 31A more specifically, a section 31A8 thereof corresponding to the control gate line lying furthest from bit line comprises composite circuit 338 consisting of two-input AND gate, three-input AND gate and NOR gate for providing composite logic output; and an inverter 319 for inverting the composite logic output. The rest of circuit structure of the section 31A8 is identical to the last and second last stages of subdecoder 31 (FIG. 3A) including inverters 312, 313, 315 and 318, and transfer gate devices $TG_1$ and $TG_2$.

Three less significant bits LA of row address signal are supplied to the input to the three-input AND gate of composite logic circuit 338, while second control signal ER is applied to one of the inputs to two-input AND gate with the other thereof grounded. The output from the inverter circuit 318 of section 31A8 constitutes decode output $XD_8$, while the output from inverter 319 is supplied as carry signal C to the two-input AND gate of composite logic circuit 337 of the next section 31A7 corresponding to the control gate line lying second furthest from bit line. The transfer of carry signal C to next section 31A7 applies to similar transfer of carry signal C from section 31A7 to second next section 31A6, from section 31A6 to third next section 31A5, and so forth.

As stated above, in a flash EEPROM with NAND structure cells, the threshold voltage of memory cell transistors needs to be set, for write (program) operation, at a value between 0V and the power supply voltage (5V in this embodiment). For that purpose, programming is usually performed in the order of starting with those memory cell transistors lying furthest from bit line-memory cell array contacts and proceeding toward those lying closer thereto. This is because the threshold values of memory cell transistors corresponding to both the outputs "0" and "1" become undistinguishable after the completion of program operation, with the result that the programming voltages (0V or 7V) applied from bit lines when the programming proceeds from those lying closer to the bit line-memory cell array contacts needs to be different. Therefore, when address signal for a certain control gate line is input from data processor at the time of inputting a command, for example, the erase mode is of practical use, in which all the control gate lines lying closer to the bit line-memory cell array contacts than that particular control gate line are subjected to simultaneous erasure. In that case, both control gate lines $CG_{12}$ and $CG_{11}$ cause erasure in response to address signal corresponding to control gate line $CG_{12}$ of p-type well 1.

To put the embodiment of FIG. 4 in the above-mentioned erase mode, the turning to H level of second control signal ER at such erase operation causes the less significant bits $LA_i$ ($LA_2$ in this embodiment) of row address signal to be input as selection signal to the three-input AND gates of composite logic circuits 331–338. As a result, composite logic circuit 332 outputs a latch signal for itself and provides a carry signal C to composite logic circuit 331 corresponding to the control gate line lying closest to the bit line-memory cell contact. Therefore, the decode output $XD_1$ of section 31A1 closer to the bit line-memory cell array contact than section 31A2 is provided for selective erasure, together with decode output $XD_2$ from section 31A2.

As has been described in the foregoing, flash EEPROM with NAND structure cells of the present invention makes it possible to perform selective erase operation on control gate line-by-control gate line basis (i.e., word line-by-word line basis) for each p-type well, owing to the provision of erase control means adapted to control the application of erase control voltage consisting of either a voltage equal to the well voltage or a reference voltage, selectively to control gate lines.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A flash EEPROM (electrically erasable programmable read-only memory) with NAND structure cells having a plurality of memory cell arrays formed respectively in at least first and second wells of one conductivity type in turn formed in the surface of a semiconductor substrate of opposite conductivity type, each said memory cell arrays having a plurality of memory cell transistors of said NAND structure cells arranged in parallel in column direction symmetrically with a predetermined line lying between said wells in row direction, each said memory cell transistors being capable of retaining in its floating gate hot electrons injected by the Fowler-Nordheim (F-N) tunnelling, source and drain of every two adjacent ones of said memory cell transistors being formed of a single highly doped diffusion region formed in said wells, control gates of corresponding ones of said memory cell transistors included respectively in said memory cell arrays being connected respectively to control gate lines lying in parallel in row direction to form word lines, first and second ends of each of said NAND structure cells being connected to source and drain respectively of first and second select transistors having control gates connected respectively to first and second select gate lines lying in parallel with said control gate lines, and drain and source respectively of said first and second select transistors of respective ones of said memory cell arrays being connected respectively to bit lines lying in parallel in column direction, characterized by further comprising:

means connected to said control gate lines and responsive to row address signal designating selected one of said control gate lines for erasure of data stored in said memory cell transistors associated therewith, for generating erase control signal consisting of first voltage to be supplied to said selected one of said control gate lines and second voltage to be supplied to unselected ones of said control gate lines, said first voltage being sufficient to remove said electrons retained in said memory cell transistors associated with said selected control gate line and, wherein said erase control signal generating means comprises:

a first portion responsive to less significant bits of said row address signal for providing decode outputs respectively for said control gate lines; and a second portion responsive to more significant bits of said row address signal for selectively allowing said decode outputs to be provided to said control gate lines of one of said first and second wells.

2. A flash EEPROM according to claim 1, wherein said first portion of said erase control signal generating means comprises:

a NAND gate for providing NAND output of said less significant bits of said row address signal;

a pair of clocked inverters responsive to a control signal for latching said NAND output;

a pair of first transfer gate means responsive to mode switching signal for controlling the passing therethrough of the output of said clocked inverters; and means responsive to the output of said first transfer gate means for providing decode outputs having said first and second voltages.

3. A flash EEPROM according to claim 2, wherein said second portion comprises:

a NAND gate for providing NAND output of said more significant bits of said row address signal;

a level shifting circuit responsive to said NAND output for providing a pair of mutually complementary outputs; and a plurality of second transfer gate means responsive to said mutually complementary outputs for selectively allowing said decode outputs to said control gate lines in selected one of said wells.

4. A flash EEPROM according to claim 1, wherein said first portion of said erase control signal generating means comprises:

a plurality of substantially identical circuit sections corresponding respectively to said control gate lines, each of said circuit sections having: a composite logic circuit consisting of a first AND gate adapted to receive said less significant bits of said row address signal, a second AND gate adapted to receive a second control signal and a carry signal supplied from next one of said circuit sections assigned to control gate line lying further from said first select transistor connected to said bit line, and a NOR gate for providing NOR output of the outputs from said first and second AND gates, said composite logic circuit being responsive to said less significant bits of said low address signal and said carry signal for providing composite logic outputs; a pair of first transfer gate means responsive to mode switching signal for controlling the passing therethrough of said composite logic output; and means respective to the output of said first transfer gate means for providing decode outputs, whereby said decode outputs from selected one of said circuit sections corresponding to said less significant bits of said row address signal and from those of said circuit sections corresponding to said control gate lines lying closer to said select transistor connected to said bit lines have first voltage.

* * * * *